(12) United States Patent (10) Patent No.: US 11,914,345 B2
Reichenbach et al. (45) Date of Patent: Feb. 27, 2024

(54) DIMM INSERTION ELECTRONIC CAM INSERTION PROFILE

(71) Applicant: Google LLC, Mountain View, CA (US)

(72) Inventors: Joseph Reichenbach, Snoqualmie, WA (US); Jeffrey Kendall, Duvall, WA (US)

(73) Assignee: Google LLC, Mountain View, CA (US)

( * ) Notice: Subject to any disclaimer, the term of this patent is extended or adjusted under 35 U.S.C. 154(b) by 472 days.

(21) Appl. No.: 16/872,983

(22) Filed: May 12, 2020

(65) Prior Publication Data

US 2021/0356937 A1 Nov. 18, 2021

(51) Int. Cl.
*G05B 19/416* (2006.01)
*G01B 11/14* (2006.01)
*G01L 1/22* (2006.01)
*H05K 13/04* (2006.01)

(52) U.S. Cl.
CPC ............ *G05B 19/416* (2013.01); *G01B 11/14* (2013.01); *G01L 1/22* (2013.01); *H05K 13/04* (2013.01); *G05B 2219/40549* (2013.01)

(58) Field of Classification Search
CPC ........ G05B 19/416; G05B 2219/40549; G01B 11/14; G01L 1/22; H05K 13/04
See application file for complete search history.

(56) References Cited

U.S. PATENT DOCUMENTS

| | | | | |
|---|---|---|---|---|
| 3,016,005 | A | * | 1/1962 | Tomka ..................... B30B 15/20 425/451.2 |
| 4,964,211 | A | * | 10/1990 | Arao ................... H05K 13/0413 29/739 |
| 5,509,192 | A | * | 4/1996 | Ota ....................... H01R 43/205 29/710 |
| 5,704,489 | A | | 1/1998 | Smith |
| 6,178,256 | B1 | | 1/2001 | Nguyen et al. |
| 6,351,827 | B1 | | 2/2002 | Co et al. |
| 6,356,094 | B1 | | 3/2002 | Tverdy et al. |
| 6,357,023 | B1 | | 3/2002 | Co et al. |

(Continued)

FOREIGN PATENT DOCUMENTS

| | | | | |
|---|---|---|---|---|
| CN | 206490963 | * | 9/2017 | |
| CN | 108733530 | * | 11/2018 | ............. G06F 11/27 |

(Continued)

OTHER PUBLICATIONS

IPC, IPC/JEDEC-9704 Printed Wiring Board Strain Gage Test Guideline, Jun. 2005, p. 3, 12, 15 (Year: 2005).*

(Continued)

*Primary Examiner* — Minh N Trinh

(74) *Attorney, Agent, or Firm* — Lerner David LLP

(57) ABSTRACT

The technology relates to a memory insertion machine for inserting memory modules into memory sockets on a circuit board. The memory insertion machine may include one or more insertion rods moveably mounted to one or more vertical guides and an insertion controller. The insertion controller may be configured to apply an insertion force to a memory module in a memory socket by controlling the movement of the one or more insertion rods on the one or more vertical guides. The movement of the one or more insertion rods may have a gradually decreasing deceleration as the insertion rods move towards the memory socket.

18 Claims, 7 Drawing Sheets

(56) References Cited

U.S. PATENT DOCUMENTS

| | | |
|---|---|---|
| 6,415,397 B1 | 7/2002 | Co et al. |
| 6,492,803 B2 | 12/2002 | Bell et al. |
| 6,999,888 B2 | 2/2006 | Repko et al. |
| 7,110,905 B2 | 9/2006 | Le et al. |
| 7,154,257 B2 | 12/2006 | Le et al. |
| 7,177,211 B2 | 2/2007 | Zimmerman |
| 7,264,491 B2 | 9/2007 | McBroom et al. |
| 7,421,365 B2 | 9/2008 | Repko et al. |
| 7,797,578 B2 | 9/2010 | Co |
| 8,022,720 B2 | 9/2011 | Co et al. |
| 2002/0067156 A1 | 6/2002 | Bell et al. |
| 2004/0078698 A1 | 4/2004 | Co et al. |
| 2005/0135054 A1 | 6/2005 | Hardt et al. |
| 2007/0269911 A1 | 11/2007 | Co et al. |
| 2009/0077293 A1 | 3/2009 | Kerrigan et al. |
| 2014/0111931 A1 | 4/2014 | Casserly et al. |
| 2015/0245529 A1* | 8/2015 | Tam ............... H05K 13/0053 29/739 |
| 2016/0381844 A1* | 12/2016 | Knox ............... H05K 3/4685 29/739 |
| 2018/0040999 A1* | 2/2018 | Yamamoto ............ G06F 1/185 |
| 2018/0324988 A1* | 11/2018 | Iwaki ..................... H05K 13/04 |
| 2021/0153400 A1* | 5/2021 | Reichenbach ........ H05K 13/04 |

FOREIGN PATENT DOCUMENTS

| | | | |
|---|---|---|---|
| CN | 209199610 U | 8/2019 | |
| KR | 20070002212 A | 1/2007 | |
| KR | 20070002212 | * 5/2007 | ............. G01R 31/26 |

OTHER PUBLICATIONS

Lin et al. Image-Sensor-Based Fast Industrial-Robot Positioning System for Assembly Implementation. Sensors and Materials, vol. 29, No. 7. Jun. 2017, pp. 935-945. Myu Tokyo.

Spong et al. Robot Modeling and Control. First Edition. Nov. 2005. 419 pages. John Wiley & Sons, Inc.

Extended European Search Report for European Patent Application No. 20211617.4 dated May 18, 2021. 8 pages.

Office Action for Chinese Patent Application No. 202011030714.9 dated Sep. 19, 2023. 7 pages.

* cited by examiner

FIG.6A
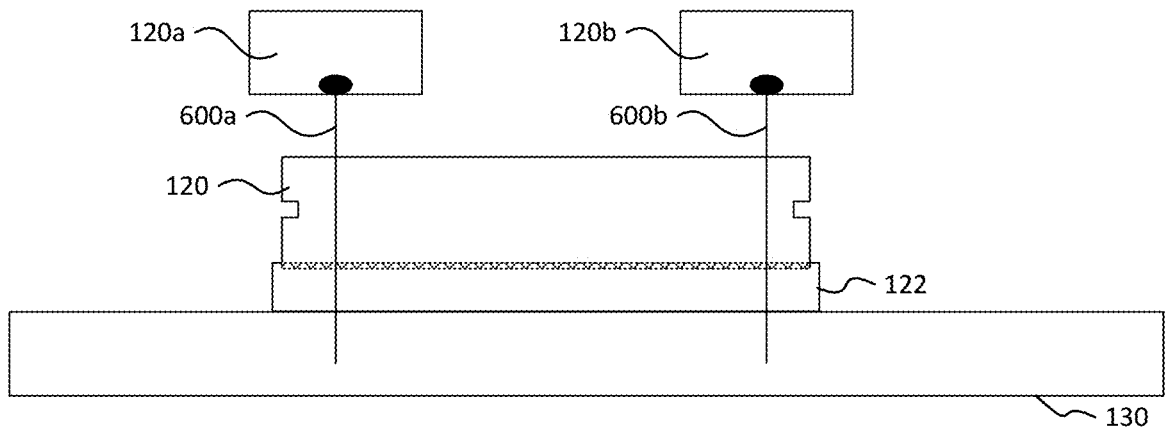
FIG. 6B
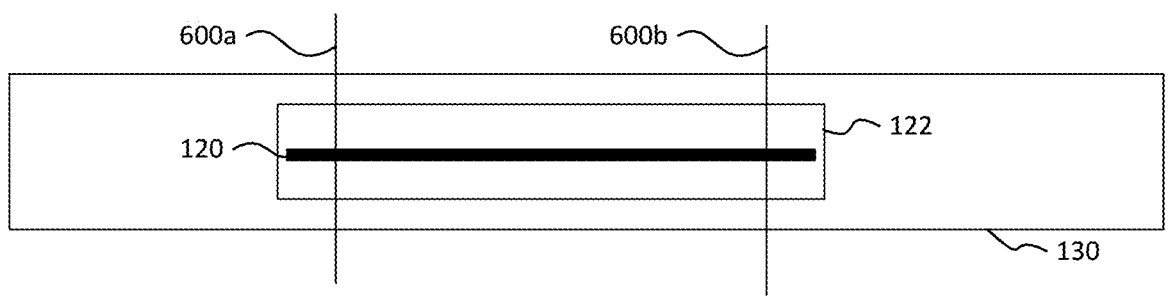
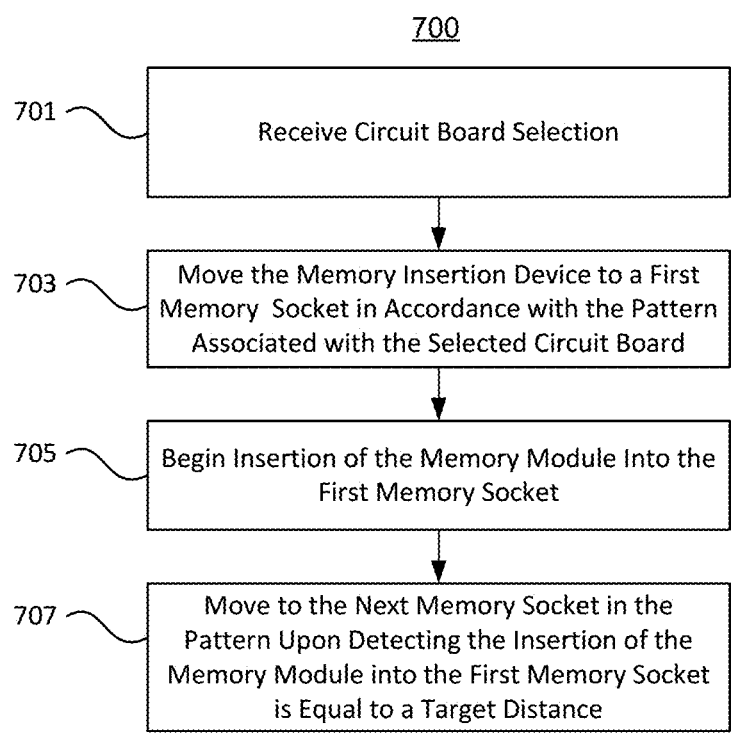
FIG. 7

DIMM INSERTION ELECTRONIC CAM INSERTION PROFILE

BACKGROUND

The proliferation of computing devices, such as web servers and workstations, has increased the demand for high speed memory. These computing devices require large amounts of high speed memory, such as DDR3 or DDR4, to operate at peak performance Given the limited capacity of each memory module, these computing devices typically rely on several memory modules such as 16, 24, 32, or more memory modules to provide the high speed memory they require to operate. The proper installation of these memory modules into the computing devices is essential to ensuring the computing devices have access to all of the high speed memory they require.

The current motion of installation of memory modules into computing devices may produce an elevated strain rate, which may result in damage to the memory module, the memory socket, and/or the circuit board.

BRIEF SUMMARY

The present disclosure provides for a device for inserting memory modules, such as Dual Inline Memory Modules (DIMM), into memory sockets, and a method for inserting such memory modules into memory sockets.

One aspect of the disclosure provides a memory insertion machine including one or more insertion rods moveably mounted to one or more vertical guides and an insertion controller. The insertion controller may be configured to apply an insertion force to a memory module in a memory socket by controlling movement of the one or more insertion rods on the one or more vertical guides. The movement of the one or more insertion rods may have a gradually decreasing deceleration as the insertion rods move towards the memory socket.

The insertion controller may be further configured to decrease a speed of the insertion rods as the insertion rods move towards the memory socket. A pattern of the gradually decreasing deceleration may be based on an empirical evaluation of prior strain rate testing. The insertion controller may be further configured to cease applying the insertion force by the one or more insertion rods when a target distance is reached. The insertion controller may be further configured to retract the one or more insertion rods when the target distance is reached. The insertion controller may include an electronic simulated cam configured to drive linear motion of the one or more insertion rods according to the gradually decreasing deceleration. The insertion controller may include a mechanical cam configured to translate rotational motion of the mechanical cam to linear motion of the one or more insertion rods.

The memory insertion machine may also include a horizontal guide and a pair of guides. A first end of the horizontal guide may be connected to one of the pair of guides and a second, opposite end of the horizontal guide may be connected to a second of the pair of guides. The one or more vertical guides may be connected to the horizontal guide. The memory insertion machine may also include a first motor configured to move the horizontal guide along a pair of guide tracks on the pair of guides, and a second motor configured to move the one or more vertical guides along a guide track in the horizontal guide. The insertion controller may be further configured to control positions of the horizontal guide and the one or more vertical guides by controlling the first motor and the second motor, respectively. The memory insertion machine may also include a pair of motors configured to move the one or more insertion rods along guide tracks in the vertical guides. The insertion controller may be further configured to control positions of the one or more insertion rods by controlling the pair of motors.

The memory insertion machine may also include an input device configured to receive a selection of a circuit board model. The circuit board model may be associated with position data indicating locations of a plurality of memory sockets on a circuit board. The insertion controller may be further configured to position the one or more insertion rods above the plurality of memory sockets in a predefined pattern, based on the position data. For each time the one or more insertion rods are positioned above a memory socket of the plurality of memory sockets, the insertion controller may cause the one or more insertion rods to apply a force to a memory module positioned in the respective memory socket until a target distance is reached. The one or more insertion rods may include two insertion rods. The two insertion rods may be positioned to push the memory module into the memory socket from opposite sides of the memory module.

Another aspect of the disclosure provides a method for inserting one or more memory modules into one or more memory sockets. The method may include applying, by one or more insertion rods, an insertion force to one of the memory modules in a corresponding one of the memory sockets, such that movement of the one of the memory modules may have a gradually decreasing deceleration as the one of the memory modules moves towards the corresponding one of the memory sockets. The method may also include controlling, by an insertion controller, the insertion force applied to the memory module by the one or more insertion rods based on the measured distance. The insertion controller may be configured to cease applying the insertion force by the one or more insertion rods when a target distance is reached.

The applying of the insertion force to the one of the memory modules may decrease a speed of the one of the memory modules as the one of the memory modules moves towards the corresponding one of the memory sockets. The method may also include, before the applying of the insertion force to the one of the memory modules, collecting empirical data of strain rate testing of at least one of the memory modules. A pattern of the gradually decreasing deceleration may be based on the empirical data. The insertion controller may include an electronic simulated cam that drives linear motion of the one or more insertion rods according to the gradually decreasing deceleration. The insertion controller may include a mechanical cam that translates rotational motion of the mechanical cam to linear motion of the one or more insertion rods.

BRIEF DESCRIPTION OF THE DRAWINGS

FIG. 6A shows a side view of profilometer beam plane in accordance with aspects of the disclosure.

FIG. 6B shows a top-down view of profilometer beam plane in accordance with aspects of the disclosure.

FIG. 7 is a flow chart in accordance with one aspect of the disclosure.

DETAILED DESCRIPTION

Figure 1A:
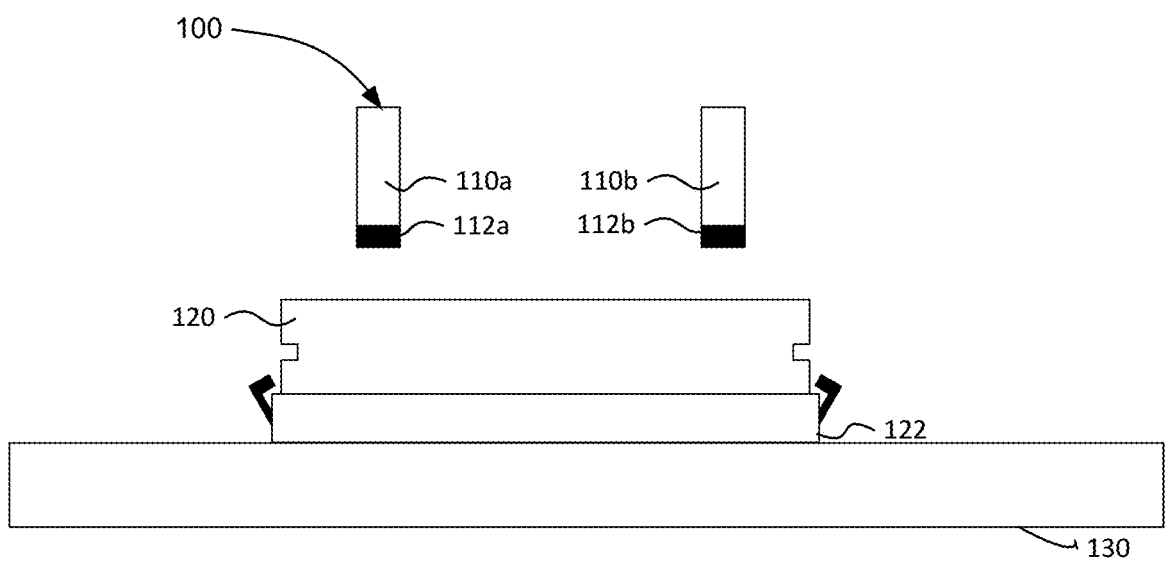
FIGS. 1A and 1B show a side view of insertion rods pushing a memory module into a memory socket mounted to a circuit board, in accordance with aspects of the disclosure.
Figure 1B:
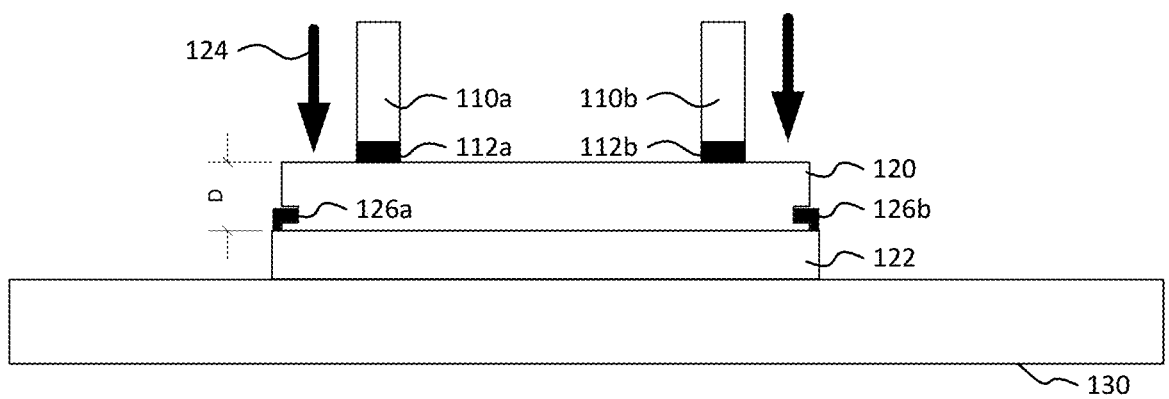

The technology relates generally to a device for inserting memory modules, such as Dual Inline Memory Modules (DIMM), into memory sockets. For example, and as illustrated in FIGS. 1A and 1B, a memory insertion machine 100 may include insertion rods 110a and 110b for pushing a memory module 120 into a memory socket 122 mounted to a circuit board 130, such as a motherboard. The insertion rods 110a, 110b may push the memory module 120 into the memory socket 122 in the direction illustrated by the arrows 124 in FIG. 1B. The downward force applied by the insertion rods 110a, 110b may cause locking clips 126a and 126b to rotate inward towards the memory module 120 and to secure the memory module into the memory socket 122 when the memory module is fully inserted into the memory socket.

The insertion rods 110a, 110b may be made of a metal, such as steel, aluminum, etc., or some other material such as plastic, wood, etc. The shape of the insertion rods may be round, square, rectangular, or any other shape. The tips of the insertion rods that contact the memory modules may include a relatively soft material to minimize the risk of damage to the memory module. For instance, and as shown in FIGS. 1A and 1B, the tips of insertion rods 110a and 110b are coated in a rubber material 112a and 112b, respectively.

The insertion rods 110a, 110b may be configured to push a memory module 120 at opposite sides thereof into a memory socket 122, as shown in FIG. 1B. In this regard, the insertion rods 110a, 110b may be configured to push down on opposite sides of the memory module 120 with relatively even force so that the memory module remains in alignment with the memory socket 122 during insertion. Although two insertion rods are shown, one insertion rod, three insertion rods, or more may be included on the memory insertion machine.

Measurements may be used to monitor the depth of insertion of the memory module 120 relative to the memory socket 122 as the insertion rods of the insertion system push the memory module 120 into the memory socket 122. In this regard, the insertion rods may continue to push the memory module into the memory socket until the relative distance from the top of the memory socket is a predetermined target distance 'D' from the top of the memory module 120. By inserting the memory module the target distance 'D', confidence that the memory module is properly seated in the memory socket, and therefore installed correctly, may be increased.

Manually installing memory modules may be labor intensive. In enterprise and manufacturing environments, hundreds, thousands, tens of thousands, or more memory modules may be installed. Systems that automate the installation process may decrease the installation time of memory modules, but both manual and automated installation may be prone to errors. These errors may include the use of too much force during insertion of a memory module into a memory socket, which may lead to broken components such as broken circuit boards, memory modules, and memory sockets. Moreover, improper installation of a memory module may lead to system failures or sub-par operation of the system. For example, memory modules that are not seated properly in a memory socket may cause the system to short-circuit. In some instances, improperly seated memory modules, which would otherwise be operational if seated properly, may be unavailable for use by the system. Additionally, troubleshooting improperly-installed memory modules in systems that have a large number of memory modules may take a significant amount of time.

Figure 1C:
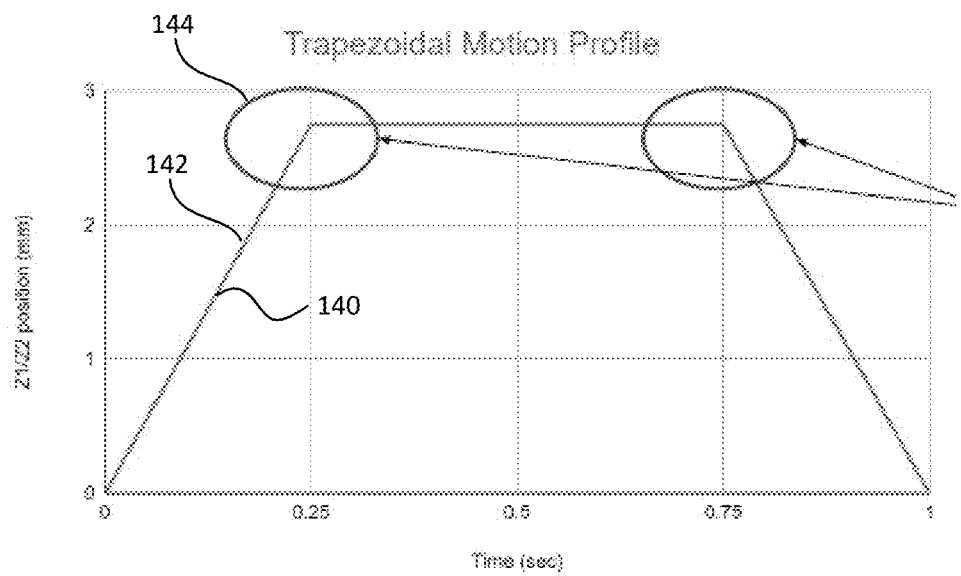
FIG. 1C is an illustration of insertion rod position measurements in accordance with aspects of the disclosure.

FIG. 1C is an illustration of insertion rod position measurements according to one example of an insertion method. The motion profile 140 illustrated in FIG. 1C has a trapezoidal shape, defined by periods 142 of constant velocity of the insertion rods 110a, 110b (and also of the memory module 120), with sharp transitions 144 when the velocity changes. Such a sharp transition 144 in the motion of the insertion rods 110a, 110b can produce an unnecessarily large deceleration of the memory module 120, resulting in an elevated strain rate, which may result in damage to the memory module, the memory socket 122, and/or the circuit board 130.

Figure 1D:
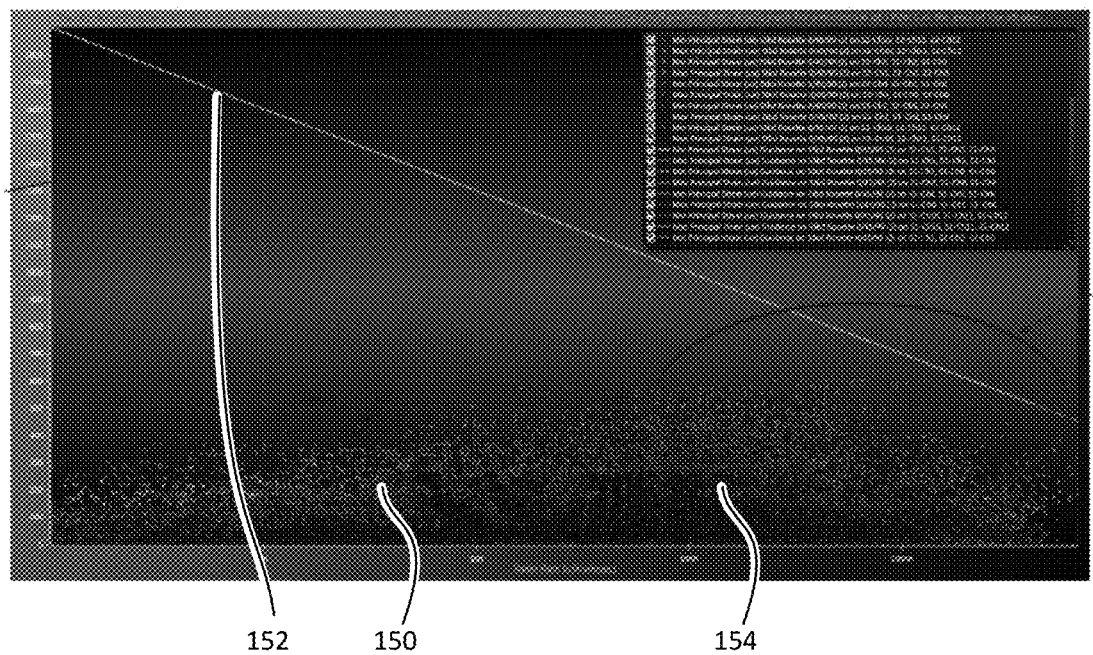
FIG. 1D is graph showing strain rate as a function of strain in accordance with aspects of the disclosure.

FIG. 1D is graph showing strain rate as a function of strain according to the insertion method of FIG. 1C. The data points 150 are experimental data of strain vs. strain rate experienced by the memory module 120 during various installation trials using the motion profile 140 of FIG. 1C. The line 152 is the maximum allowable strain rate that will likely result in damage to the memory module 120, the memory socket 122, and/or the circuit board 130. Region 154 shows a portion of the data points 150 that are close to the line 152 that is the maximum allowable strain. This region 154 is a region of elevated strain, which it is desirable to minimize or eliminate.

Figure 1E:
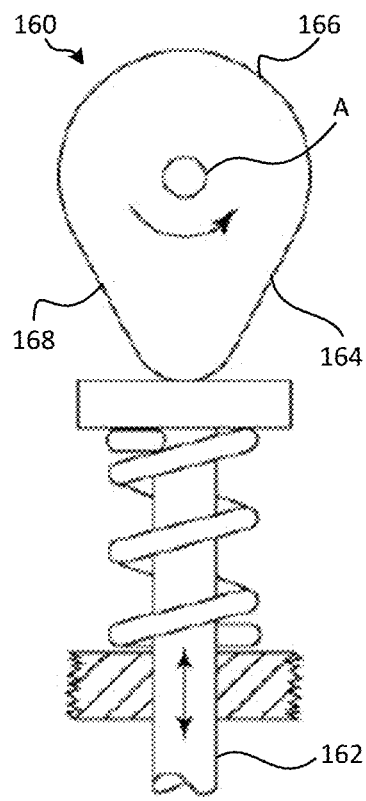
FIG. 1E is a side view of a mechanical cam coupled to a follower in accordance with aspects of the disclosure.
Figure 1F:
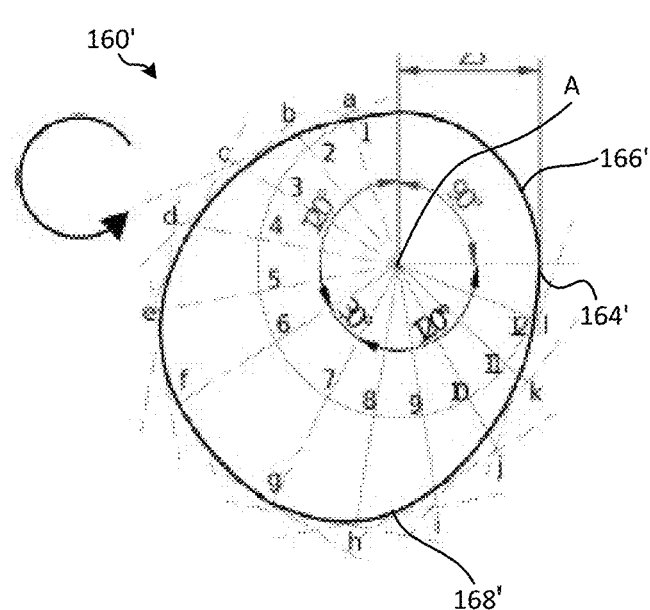
FIG. 1F is a side view of a mechanical cam that is a variation of the mechanical cam of FIG. 1E.
Figure 1G:
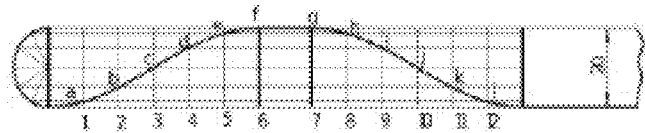
FIG. 1G is a graph showing the displacement of an end of a follower coupled to the leader cam of FIG. 1F.

FIG. 1E is a mechanical cam 160, in which a follower 162 changes vertical position based on the rotational motion of a leader cam 164, due to the leader cam having some peripheral portions 166 close to the rotational axis A and other peripheral portions 168 farther away from the rotational axis. FIG. 1F is a mechanical cam 160' that is a variation of the mechanical cam 160, in which a leader cam 164' has some peripheral portions 166' close to the rotational axis A and other peripheral portions 168' farther away from the rotational axis, but the shape of the periphery of the cam 160' is different than the periphery of the cam 160. FIG. 1G shows the resultant displacement of an end of a follower coupled to the leader cam 164', which has a rounded trapezoidal shape, with the displacement of the follower cam shown at each of the points a-1 that correspond to the rotational positions 1-12 of the leader cam 164'.

Figure 1H:
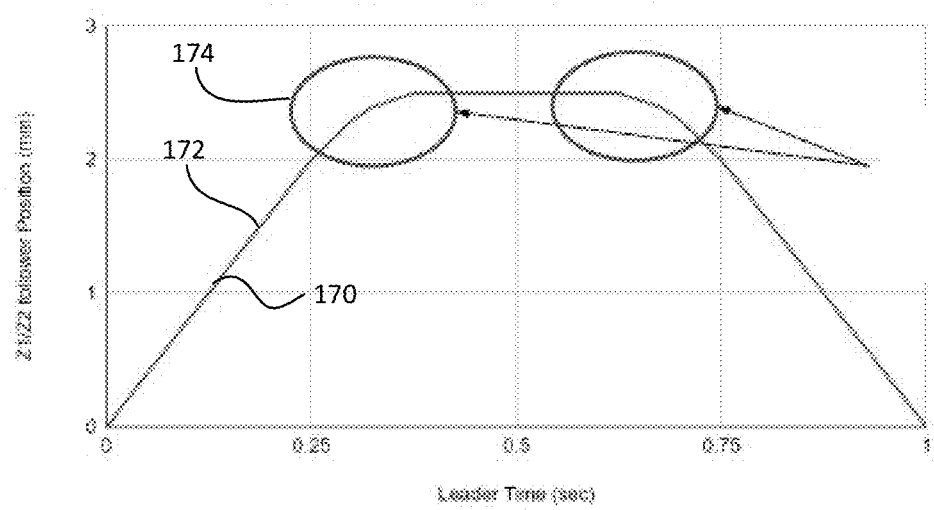
FIG. 1H is an illustration of insertion rod position measurements in accordance with aspects of the disclosure.

FIG. 1H is an illustration of insertion rod position measurements according to one example of an insertion method that results from the use of a cam such as the mechanical cam 160 or 160'. The motion profile 170 illustrated in FIG. 1H has a rounded trapezoidal shape, defined by periods 172 of constant velocity of the insertion rods 110a, 110b (and also of the memory module 120) of FIGS. 1A and 1B, with gradual transitions 174 when the velocity changes. Such a gradual transition 174 in the motion of the insertion rods 110a, 110b can gradually reduce the deceleration of the memory module 120, resulting in a lower strain rate, which may avoid damage to the memory module, the memory socket 122, and/or the circuit board 130. The specific values of leader time and follower position that are plotted in the motion profile 170 of FIG. 1H are shown below in Table 1.

TABLE 1

| Leader Time (sec) | Follower Position (mm) |
|---|---|
| 0 | 0 |
| 0.25 | 2 |
| 0.275 | 2.15 |
| 0.3 | 2.3 |
| 0.325 | 2.4 |
| 0.35 | 2.45 |
| 0.375 | 2.5 |
| 0.625 | 2.5 |
| 0.65 | 2.45 |
| 0.675 | 2.4 |
| 0.7 | 2.3 |
| 0.725 | 2.15 |
| 0.75 | 2 |
| 1 | 0 |

To have the motion of the insertion rods 110a, 110b (and also of the memory module 120) of FIGS. 1A and 1B produce the gradual transitions 174 of FIG. 1H, rather than the sharp transitions 144 of FIG. 1C, the follower position vs. time data of Table 1 can be programmatically implemented using servo motion to produce motion of an "electronic cam," rather than a mechanical cam. If such an electronic cam is used, it is not necessary to machine a mechanical cam that has exactly the required surface profile. Rather, data that governs follower position vs. time can be developed based on empirical evaluation of strain rate testing, based on data such as the strain data points 150 of FIG. 1D. Using such a method, an electronic cam can be designed that has a follower position vs. time profile that is optimized to avoid a region of elevated strain such as the region 154 of FIG. 1D.

Figure 2A:
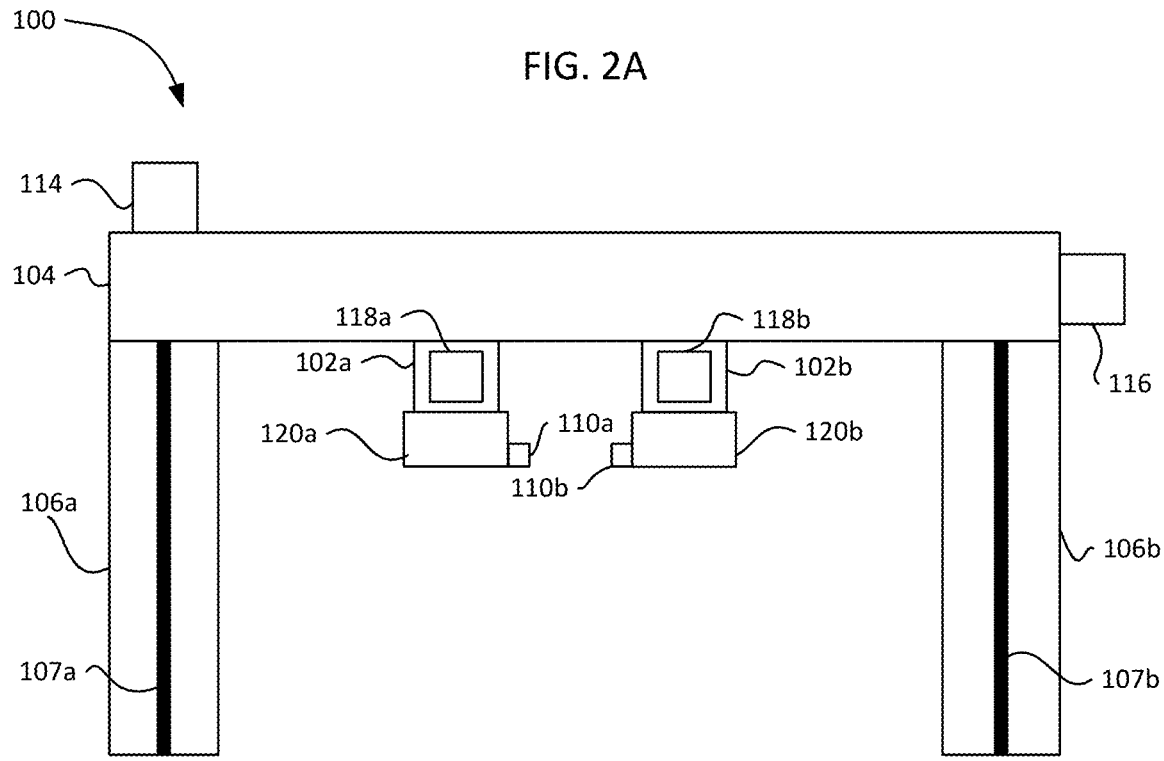
FIG. 2A shows a top-down view of the memory insertion machine in accordance with aspects of the disclosure.

FIG. 2A shows a top-down view of the memory insertion machine 100 that is configured to move the insertion rods 110a, 110b of FIGS. 1A and 1B. The memory insertion machine 100 includes the insertion rods 110a, 110b and profilometers 120a, 120b. The insertion rods 110a, 110b and profilometers 120a, 120b are mounted or otherwise attached to vertical guides 102a, 102b. Vertical guides 102a, 102b may be mounted or otherwise attached to horizontal guide 104, which in turn is mounted to a pair of guides 106a and 106b.

The guides, including the vertical guides 102a, 102b, the horizontal guide 104, and the pair of guides 106a, 106b may include guide slots, tracks, or other such guiding elements for positioning other guides, insertion rods, or profilometers. For instance, and as shown in FIG. 2A, each guide in the pair of guides 106a, 106b may include guide tracks 107a, 107b, respectively, in which opposing ends of the horizontal guide 104 may be moveably attached. In this regard, each of the opposing ends of the horizontal guide 104 may include a carriage or other such device that connects to guide tracks in the pair of guides 106a, 106b. Although the guide tracks 107a, 107b are shown as being on the top surface of each guide in the pair of guides, the guide tracks may be on any surface of the pair of guides, such as the sides or bottom.

Figure 2B:
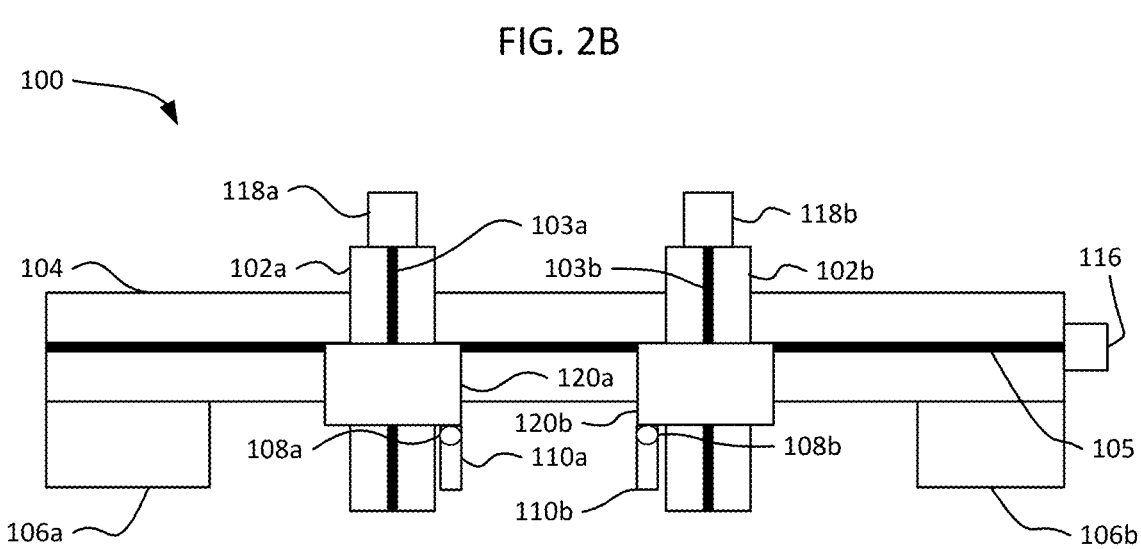
FIG. 2B shows a side view of the memory insertion machine in accordance with aspects of the disclosure.

FIG. 2B shows a front view of the memory insertion machine 100, including a guide track 105 on the horizontal guide 104 and guide tracks 103a and 103b on the vertical guides 102a and 102b, respectively. The vertical guides 102a and 102b may be movably connected to the guide track 105 on the horizontal guide 104. Profilometers 120a and 120b may each be moveably connected to a guide track of the vertical guides 102a and 102b, respectively. Although FIGS. 2A and 2B illustrate the insertion rods 110a, 110b being connected to the profilometers 120a, 120b, the insertion rods may be directly connected to guide tracks of the vertical guides or connected to the guide tracks of the vertical guides through intermediary connectors or other such devices.

Movement of the guides, insertion rods, and profilometers may be implemented by drive units, such as servo motors, actuators including screw and belt driven actuators, or other such devices capable of controlling movements. For example, a first motor 114 may control movement of the horizontal guide 104 along the guide tracks 107a, 107b of the pair of guides, as shown in FIG. 2A. A second motor 116 may control movement of the vertical guides 102a, 102b along the guide track 105 of the horizontal guide. Movement of the insertion rods 110a, 110b and profilometers 120a, 120b on the guide tracks 103a, 103b of the vertical guides 102a, 102b, respectively, may be controlled by additional motors 118a, 118b, as shown in FIG. 2B.

Figure 3A:
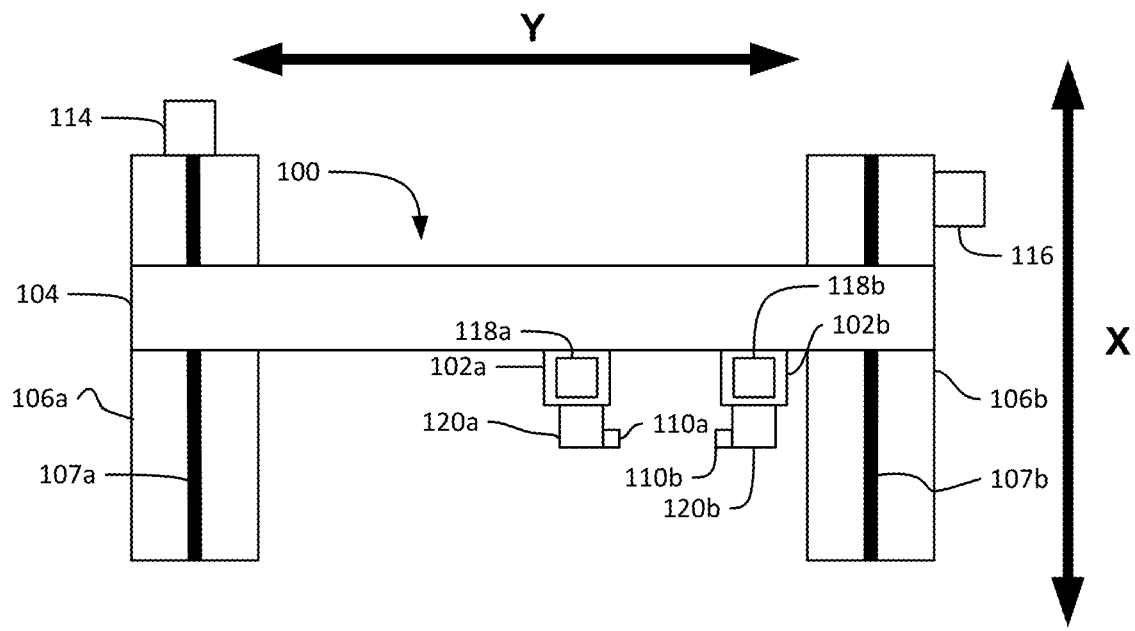
FIG. 3A shows a top-down view of movements of the memory insertion machine in accordance with aspects of the disclosure.
Figure 3B:
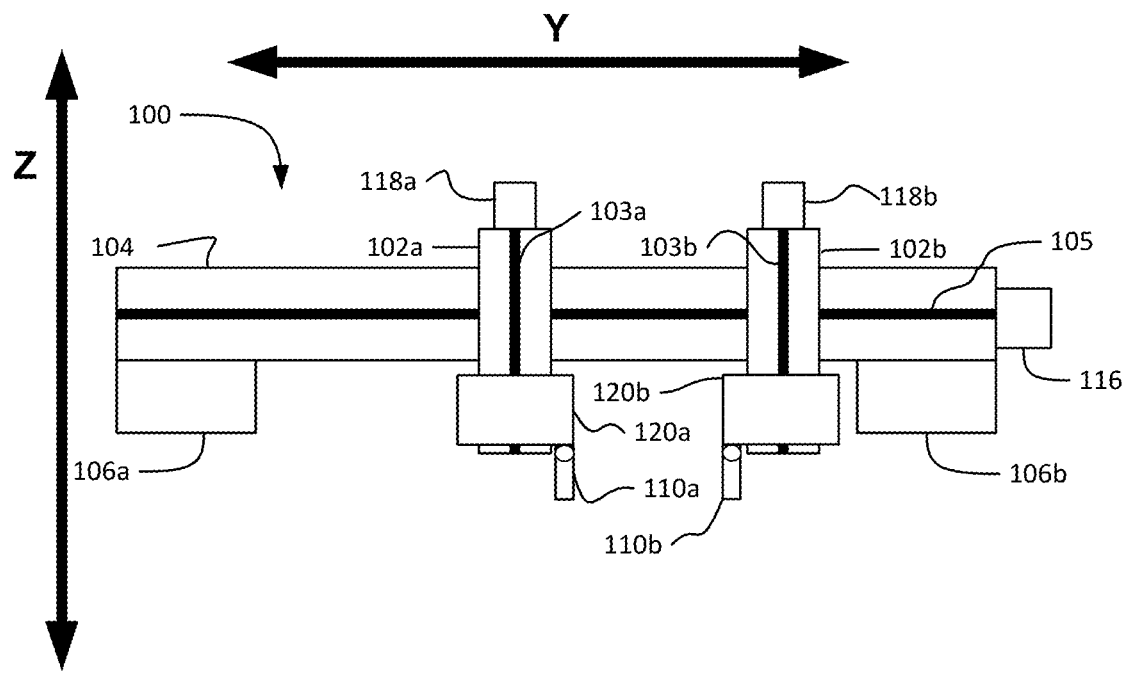
FIG. 3B shows a side view of movements of the memory insertion machine in accordance with aspects of the disclosure.

Example movements of the guides, insertion rods, and profilometers, relative to the positions shown in FIGS. 2A and 2B, are shown in FIGS. 3A and 3B, respectively. Turning to FIG. 3A, the first motor 114 may move the horizontal guide 104 along the guides tracks 107a, 107b of the pair of guides 106a, 106b in the X direction.

As shown in FIG. 3B, the second motor 116 may move the vertical guides 102a, 102b along the guide track 105 of the horizontal guide 104 in the Y direction. Additional motors 118a, 118b may move the profilometers 120a, 120b and insertion rods 110a, 110b along the guide tracks 103a, 103b of the vertical guides 102a, 102b along the Z direction. Although both the profilometers 120a, 120b and insertion rods 110a, 110b are shown moving along the Z direction in FIG. 3B, the profilometers may remain stationary along the Z direction. In this regard, the position of the profilometers may be not be controlled by the additional motors 118a, 118b.

Figure 4:
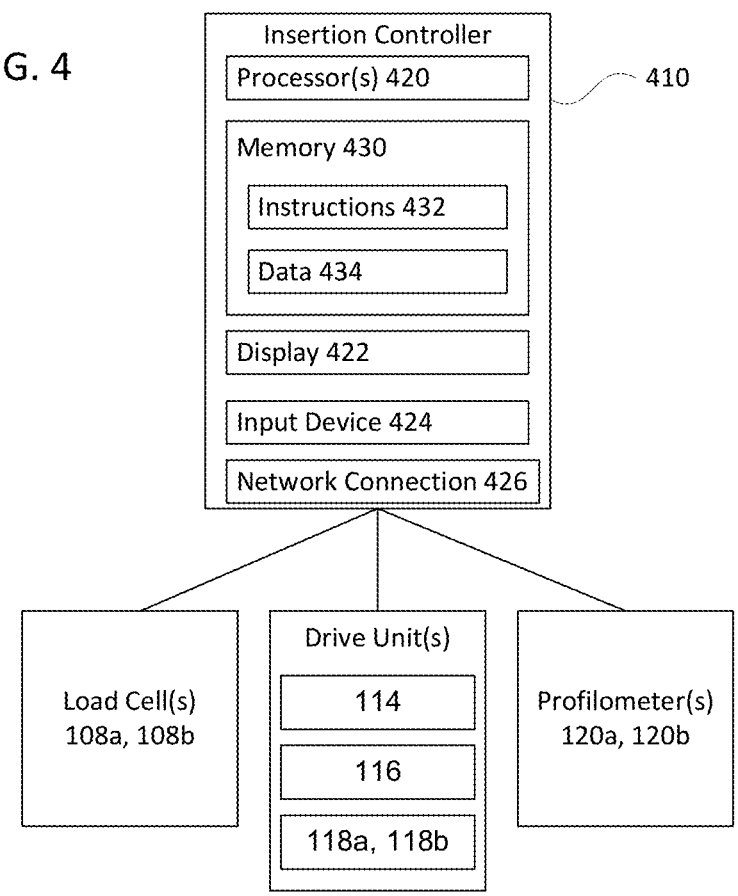
FIG. 4 shows a block diagram of an insertion controller in accordance with aspects of the disclosure.

The operation of the memory insertion system 100 may be controlled by an insertion controller 410, shown in FIG. 4. The insertion controller 410 may include a processor 420 and memory 430. The processor may be any conventional processor, such as processors from Intel Corporation or Advanced Micro Devices. Alternatively, the processor may be a dedicated controller such as an application specific integrated circuit (ASIC), field programmable gate array (FPGA), etc. Additionally, the processor 420 may include multiple processors, multi-core processors, or a combination thereof. Although only one processor 420 is shown in FIG. 4, one of ordinary skill in the art would recognize that several processors may exist within insertion controller 410. Accordingly, references to a processor will be understood to include references to a collection of processors or dedicated logic that may or may not operate in parallel.

The memory 430 stores information accessible by the one or more processors 420, including instructions 432 and data 434 that may be executed or otherwise used by the processor 420. The memory 430 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 432 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 434 may be retrieved, stored or modified by processor 420 in accordance with the instructions 432. For instance, although the claimed subject matter is not limited by any particular data structure, the data may be stored in computing device registers, in a relational database as a table having a plurality of different fields and records, XML documents or flat files. The data may also be formatted in any computing device-readable format.

The insertion controller 410 may include all of the components normally used in connection with a computing device such as the processor and memory described above as well as an input device (e.g., a mouse, keyboard, touch screen, buttons, and/or microphone) and various electronic displays (e.g., a monitor having a screen or any other electrical device that is operable to display information). In this example, the insertion controller includes a display 422 as well as input device 424. In some instances, the display may be a touch screen display capable of operating as a user input. The input device 424 and/or display 422 may be used to receive a selection of a circuit board model into which memory modules are to be inserted by the memory insertion machine 100, as described herein.

The insertion controller 410 may also include one or more network connections 426 to facilitate communication with other computing and storage devices. The network connections 426 may include wired or wireless communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, Wi-Fi and HTTP, and various combinations of the foregoing.

The insertion controller 410 may store in memory 430 position data of one or more circuit board models. The position data for each circuit board model may include the locations of memory sockets relative to a known location. For instance, the memory insertion machine 100 may have a known location where circuit boards are positioned relative to an initial starting position of the memory insertion machine 100. In some instances, the position data may be retrieved by the insertion controller 410 from another storage device, such as a networked attached storage device.

The insertion controller 410 may be configured to communicate with load cells 108a, 108b that measure the force applied by each insertion rod 110a, 110b. In this regard, a load cell may be mounted on or in the vicinity of an insertion rod. As the insertion rods 110a, 110b push a memory module into a memory socket, each load cell 108a, 108b may detect the force being applied by a respective insertion rod and forward the information to the insertion controller. For example, and as shown in FIG. 2B, load cell 108a may monitor the force being applied by insertion rod 110a and load cell 108b may monitor the force being applied by insertion rod 110b.

The forces measured by the load cells may be provided to insertion controller 410. In the event the force measured by one or more of the load cells is greater than a threshold value, such as 35 pound-force, the insertion controller 410 may direct the drive units, such as motors 114, 116, 118a, and 118b, to cease movement of the insertion rods 110a, 110b and therefore prevent increases in forces applied to the memory module. By doing such, the risk of damage to the memory module, memory socket, and/or circuit board may be reduced. In some instances, the insertion controller 410 may cause the drive units to retract the insertion rods 110a, 110b away from the memory modules. Although only two load cells are shown in FIG. 2B, there may be any number of load cells. For instance, each insertion rod may have two or more load cells monitoring its insertion force. In examples where more than two insertion rods are present, there may be one or more load cells for each additional insertion rod.

The insertion controller 410 may be configured to communicate with the drive units, such as motors 114, 116, 118a, and 118b to control the positioning of the guides, insertion rods, and profilometers relative to memory sockets on a circuit board. In this regard, based on the position data and known location, the insertion controller 410 may communicate with the drive units to position the insertion rods relative to the memory sockets on a circuit board and have the insertion rods push a memory module into the memory socket. This process may be repeated until memory modules are inserted into all memory sockets on the circuit board model.

Figure 5:
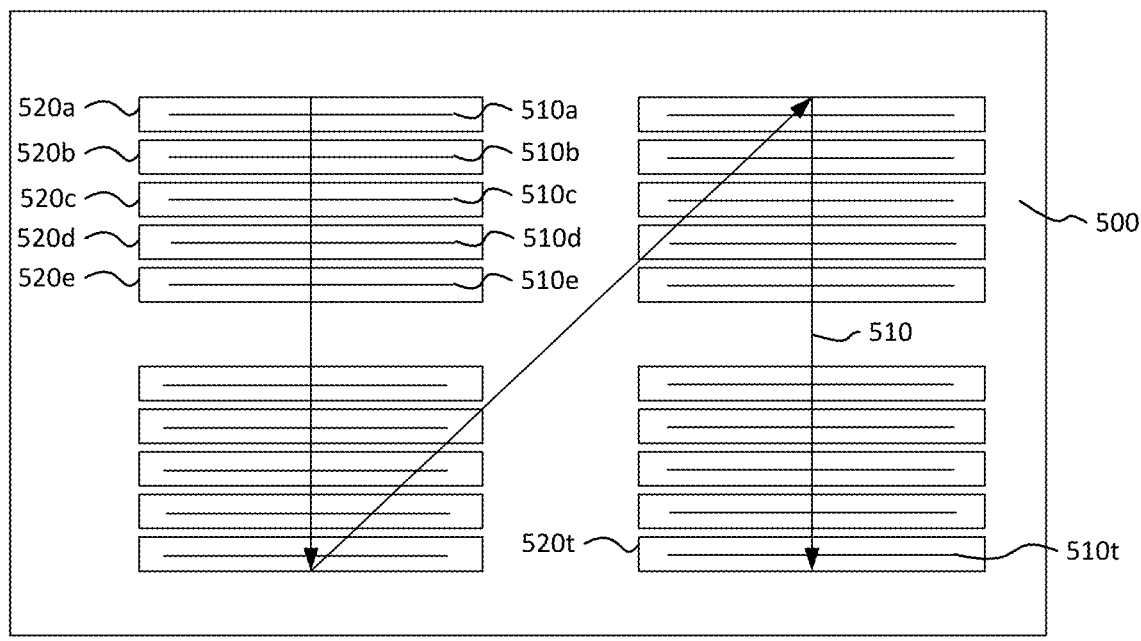
FIG. 5 illustrates an insertion pattern in accordance with aspects of the disclosure.

For example, as shown in FIG. 5, on a circuit board 500 having 20 memory sockets 520a-520t, the insertion controller 410 may control the memory insertion machine 100 such that it positions the insertion rods above memory modules 510a-510t positioned in memory sockets 520a-520t, respectively, in a programmed pattern 510. The pattern may be stored in association with the position data corresponding to the circuit board 500. According to pattern 510, the insertion controller 410 may control the drive units 114, 116, 118a, and 118b such that the insertion rods 110a, 110b of memory insertion machine 100 are positioned above memory socket 520a. When the insertion rods 110a, 110b are positioned above the memory socket 520a, the insertion rods 110a, 110b may push the memory module 510a into memory socket 520a. After memory module 510a is inserted, the insertion controller 410 may move the memory insertion machine 100 to a position relative to memory socket 520b. Memory module 510b may then be inserted into memory socket 520b. The memory insertion machine 100 may be moved according to pattern 510 until all memory modules are inserted into their respective memory sockets.

As shown in FIGS. 6A and 6B, the profilometers 120*a*, 120*b* may provide distance measurements between a memory module and a memory socket to the insertion controller 410. In this regard, the profilometers 120*a*, 120*b* may be positioned such that they can capture distance measurements for the memory module and the memory socket on opposite sides thereof. For example, and as shown in the side view of memory socket 122 and circuit board 130 in FIG. 6A, profilometers 120*a* and 120*b* are positioned on opposite sides of memory module 120. By positioning the profilometers 120*a*, 120*b* on opposite sides of the memory module 120, the insertion distance of the memory module 120 into the memory socket 122 of circuit board 130 caused by each of the insertion rods may be monitored by the insertion controller 410. Although only two profilometers 120*a* and 120*b* are shown, the memory insertion machine 100 may include any number of profilometers. Each profilometer may transmit and receive a beam plane 600*a* and 600*b*, as shown in FIGS. 6A and 6B. As shown in the top-down view of the memory socket 122 and circuit board 130 of FIG. 6B, the beam plane may capture data across the entirety of memory socket 122 on both sides of memory module 120.

Referring to FIG. 7, in addition to the operations described above and illustrated in the figures, various operations will now be described. The following operations do not have to be performed in the precise order described below. Rather, various steps can be handled in a different order or simultaneously, and steps may also be added or omitted. FIG. 7 illustrates a flow chart 700 showing an example memory insertion operation of the memory insertion machine 100. As shown in block 701, the memory insertion machine 100 may receive a selection of a circuit board model via an input or command, such as a selection on input device 424. Based on the selection, the insertion controller may control the memory insertion machine 100 such that it pushes each memory module into a memory socket. In this regard, the insertion controller 410 may control the various drive units, including motors 114, 116, 118*a*, and 118*b*, such that they move the memory insertion machine in accordance with a pattern corresponding to the selected circuit board model, starting with a first memory socket as shown in block 703.

At each memory socket, the memory insertion machine 100 may insert a memory module into the memory socket. For instance, at the first memory socket, the memory insertion machine 100 may begin insertion of a memory module in the first memory socket, as shown in block 705. The insertion controller 410 may control the memory insertion machine 100 and advance the insertion rods and other components of the memory insertion machine to the next memory module in the pattern once the distance of the first memory module in the first memory socket reaches a target distance 'D', as shown in block 707.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A memory insertion machine comprising:
   one or more insertion rods moveably mounted to one or more vertical guides, the one or more insertion rods comprising corresponding tips configured to contact a memory module;
   a horizontal guide, wherein the one or more vertical guides are connected to the horizontal guide; and
   an insertion controller configured to apply an insertion force via the corresponding tips to the memory module in a memory socket by controlling movement of the one or more insertions rods on the one or more vertical guides;
   wherein the insertion controller includes an electronic simulated cam or a mechanical cam, the electronic simulated cam or the mechanical cam configured to drive linear motion of the one or more insertion rods according to gradually decreasing velocity.

2. The memory insertion machine of claim 1, wherein the insertion controller is further configured to decrease a speed of the insertion rods as the insertion rods move towards the memory socket.

3. The memory insertion machine of claim 1, wherein a pattern of the gradually decreasing velocity is based on an empirical evaluation of prior strain rate testing.

4. The memory insertion machine of claim 1, wherein the insertion controller is further configured to cease applying the insertion force by the one or more insertion rods when a target distance is reached.

5. The memory insertion machine of claim 4, wherein the insertion controller is further configured to retract the one or more insertion rods when the target distance is reached.

6. The memory insertion machine of claim 1, further comprising;
   a pair of guides, wherein a first end of the horizontal guide is connected to one of the pair of guides and a second, opposite end of the horizontal guide is connected to a second of the pair of guides.

7. The memory insertion machine of claim 6, further comprising:
   a first motor configured to move the horizontal guide along a pair of guide tracks on the pair of guides; and
   a second motor configured to move the one or more vertical guides along a guide track in the horizontal guide.

8. The memory insertion machine of claim 7, wherein the insertion controller is further configured to control positions of the horizontal guide and the one or more vertical guides by controlling the first motor and the second motor, respectively.

9. The memory insertion machine of claim 1, further comprising:
   a pair of motors configured to move the one or more insertion rods along guide tracks in the vertical guides, wherein the insertion controller is further configured to control positions of the one or more insertion rods by controlling the pair of motors.

10. The memory insertion machine of claim 1, further comprising:
    an input device configured to receive a selection of a circuit board model, wherein the circuit board model is associated with position data indicating locations of a plurality of memory sockets on a circuit board.

11. The memory insertion machine of claim 10, wherein the insertion controller is further configured to position the one or more insertion rods above the plurality of memory sockets in a predefined pattern, based on the position data.

12. The memory insertion machine of claim 11, wherein for each time the one or more insertion rods are positioned above the memory socket of the plurality of memory sockets, the insertion controller causes the one or more insertion rods to apply the insertion force to the memory module positioned in the respective memory socket until a target distance is reached.

13. The memory insertion machine of claim 1, wherein the one or more insertion rods includes two insertion rods, the two insertion rods positioned to push the memory module into the memory socket from opposite sides of the memory module.

14. A method for inserting one or more memory modules into one or more memory sockets using an insertion machine, the method comprising:
  providing the insertion machine comprising:
    one or more insertion rods moveably mounted to one or more vertical guides, the one or more insertion rods comprising corresponding tips configured to contact a memory module;
    a horizontal guide, wherein the one or more vertical guides are connected to the horizontal guide; and
    an insertion controller configured to apply an insertion force via the corresponding tips to the memory module in a memory socket by controlling movement of the one or more insertions rods on the one or more vertical guides;
    wherein the insertion controller includes an electronic simulated cam or a mechanical cam, the electronic simulated cam or the mechanical cam configured to drive linear motion of the one or more insertion rods according to gradually decreasing velocity,
  applying, by the one or more insertion rods, the insertion force via the corresponding tips configured to contact a memory module to one of the memory modules in a corresponding one of the memory sockets, such that movement of the one of the one or more insertion rods has a gradually decreasing velocity as the one of the memory modules moves towards the corresponding one of the memory sockets; and
  controlling, by the insertion controller, the insertion force applied to the one of the memory modules by the one or more insertion rods based on a measured distance, the insertion controller configured to cease applying the insertion force by the one or more insertion rods when a target distance is reached.

15. The method of claim 14, wherein the applying of the insertion force to the one of the memory modules decreases a speed of the one of the memory modules as the one of the memory modules moves towards the corresponding one of the memory sockets.

16. The method of claim 14, further comprising:
  before the applying of the insertion force to the one of the memory modules, collecting empirical data of strain rate testing of at least one of the memory modules, wherein a pattern of the gradually decreasing velocity is based on the empirical data.

17. The method of claim 14, wherein the gradually decreasing velocity of the one or more insertion rods is caused by an electronic simulated cam of the insertion controller, wherein the electronic simulated cam drives linear motion of the one or more insertion rods.

18. The method of claim 14, wherein the gradually decreasing velocity of the one or more insertion rods is caused by a mechanical cam of the insertion controller, wherein the mechanical cam translates rotational motion of the mechanical cam to linear motion of the one or more insertion rods.

* * * * *